US012808945B2

(12) United States Patent
Grigoryev

(10) Patent No.: US 12,808,945 B2
(45) Date of Patent: Nov. 24, 2026

(54) ELECTRIC VEHICLE BATTERY LOAD EMULATOR CIRCUIT

(71) Applicant: Tesco—The Eastern Specialty Company, Inc., Bristol, PA (US)

(72) Inventor: Iosif A. Grigoryev, Jamison, PA (US)

(73) Assignee: TESCO—THE EASTERN SPECIALTY COMPANY, INC., Bristol, PA (US)

( * ) Notice: Subject to any disclaimer, the term of this patent is extended or adjusted under 35 U.S.C. 154(b) by 86 days.

(21) Appl. No.: 19/191,764

(22) Filed: Apr. 28, 2025

(65) Prior Publication Data

US 2025/0340136 A1 Nov. 6, 2025

Related U.S. Application Data

(60) Provisional application No. 63/642,279, filed on May 3, 2024.

(51) Int. Cl.

| | |
|---|---|
| ***G01R 31/40*** | (2020.01) |
| ***B60L 50/90*** | (2019.01) |
| ***B60L 53/00*** | (2019.01) |
| ***G05F 1/577*** | (2006.01) |
| ***H02J 7/00*** | (2006.01) |

(52) U.S. Cl.

CPC .............. *G01R 31/40* (2013.01); *B60L 50/90* (2019.02); *B60L 53/00* (2019.02); *G05F 1/577* (2013.01); *H02J 7/00* (2013.01)

(58) Field of Classification Search

CPC ......... G01R 31/40; B60L 53/00; B60L 50/90; G05F 1/577; H02J 7/00

See application file for complete search history.

(56) References Cited

U.S. PATENT DOCUMENTS 4,426,612 A * 1/1984 Wicnienski ............... H02J 7/96 320/153
4,878,009 A * 10/1989 Esser ...................... G05F 1/575 323/280
5,917,331 A * 6/1999 Persons ............. G01R 31/3004 324/762.02

(Continued)

OTHER PUBLICATIONS

European Patent Office, Extended European Search Report, Appln. No. 25173711.0, Sep. 24, 2025, 8 pages.

(Continued)

*Primary Examiner* — Gary L Laxton
(74) *Attorney, Agent, or Firm* — Niels Haun; Dann, Dorfman, Herrell & Skillman, P.C.

(57) ABSTRACT

An electrical circuit that emulates a battery, e.g., an EV battery, when being charged may comprise: terminals configured to connect to a battery charging device; and a regulator circuit including: a voltage sensing circuit for sensing the voltage at the terminals and providing a voltage proportional thereto; a comparator circuit responsive to the difference between the voltage sensing circuit and the reference voltage; a controllable load circuit connected to the terminals and including a controllable element responsive to the comparator circuit for causing a current to flow between the terminals; whereby the current flowing in the controllable load circuit is controlled to maintain the voltage between the terminals at a voltage that is proportional to the reference voltage.

32 Claims, 3 Drawing Sheets

(56) References Cited

U.S. PATENT DOCUMENTS

| | | | | |
|---|---|---|---|---|
| 6,204,647 | B1 * | 3/2001 | Niemann | G01R 31/36 327/563 |
| 6,211,726 | B1 * | 4/2001 | Daun-Lindberg | G11C 5/147 327/56 |
| 7,764,066 | B2 * | 7/2010 | Horning | G01R 31/2848 324/426 |
| 8,242,629 | B2 | 8/2012 | Palatini et al. | |
| 8,749,091 | B2 | 6/2014 | Skarani | |
| 9,459,328 | B2 * | 10/2016 | Lin | G01R 31/2848 |
| 11,480,626 | B1 | 10/2022 | Sarwat | |
| 11,874,322 | B1 | 1/2024 | Sterzbach | |
| 12,228,606 | B2 * | 2/2025 | Yi | G01R 31/2827 |
| 2004/0036496 | A1 * | 2/2004 | Liu | G01R 31/40 324/764.01 |
| 2008/0150547 | A1 * | 6/2008 | Wong | G01R 31/40 324/555 |
| 2019/0011941 | A1 * | 1/2019 | König | G01M 13/02 |
| 2024/0103083 | A1 * | 3/2024 | Dixon | G01R 31/2846 |
| 2025/0202257 | A1 * | 6/2025 | Carey | H02J 7/855 |

OTHER PUBLICATIONS

TDI Power, "RBL488 Series Electronic Loads Operation & Programming Manual", Doc 402825, Rev B, V3, Dec. 31, 2004, pp. 1-146.

* cited by examiner

ELECTRIC VEHICLE BATTERY LOAD EMULATOR CIRCUIT

The present invention relates to an electrical circuit that emulates a battery and, in particular, to an electrical circuit that emulates a battery as a load for a battery charging device, e.g., a battery charging device for a battery of or for an electric vehicle.

Batteries, and in particular high-capacity rechargeable batteries, are coming into increased use as more and more devices and equipment is changing over from fossil fuel to electric power. A prime example thereof is the electric vehicle (herein "EV") which is completely powered by a high-capacity rechargeable battery and which is steadily gaining market share in vehicles produced and sold as a result of government mandates and financial incentives. To further that governmental goal, governments are encouraging, mandating and subsidizing the installation of vehicle charging stations to create an infrastructure to support the use of electric vehicles.

As millions of EVS come into use, hundreds of thousands of electric vehicle charging stations will be needed to meet the demand for charging the batteries of those EVS. Each of those charging stations will have at least one and likely more than one battery charger, and each will likely be configured for charging electric vehicles produced by different manufacturers and/or to different charging and/or battery standards. Moreover, one can imagine battery charging facilities wherein plural or multiple EV batteries of different kinds could be charging at the same time and could require different levels of voltage and/or current while charging.

This will almost certainly require that such battery charging devices meet certain standards for configuration and for battery charging protocols. As a result, a means to test the functioning and performance of such charging devices will be needed and that will necessitate that there be a battery or its equivalent for such unit to be tested with. Charging an actual EV battery will not likely provide a suitable or practical test configuration.

Conventional test loads typically include banks of power dissipating resistors that are switched into and out of circuit to provide a desired load resistance. Such test loads are resistive and so the terminal voltage and the current flowing therethrough are related by Ohm's Law, which is nothing like the characteristic of a battery whose terminal voltage, a DC voltage, does not change by a large amount as the current, e.g., charging current, applied thereto increases and decreases; in other words, a battery approximates a constant voltage load over a range of current levels. Thus, conventional test loads are not suitable representations of a battery for use in testing of a battery charger.

With regard to electric vehicle batteries, which operate at a very high terminal voltage, e.g., about 350-450 VDC and about 750-900 VDC, and which can be charged at relatively high currents, e.g., up to about 600-650 amperes, stringent demands are placed upon devices for testing and evaluating the charging devices, e.g., DC charging stations, for EV batteries and vehicles containing such batteries. It is noted that while a manufacturer of an EVSE (Electric Vehicle Supply Equipment) charging device may advertise their chargers can operate at up to 500 VDC or up to 1000 VDC, as a practical matter the terminal voltage of an EV battery is typically around 380 VDC, and so the ranges ago are believed to be sufficient for battery emulator 10 when emulator 10 is employed for emulating an EV battery. It is also noted that while an EV manufacturer may advertise its EV battery as being capable of being charged at up to 900 amperes, 600-650 amperes is likely a more realistic level; in any event, the current capacity of battery emulator 10 may be increased or decreased by adding as many additional loads 70 as are needed to accommodate the desired current carrying capacity.

Applicant believes there may be a need for an electrical circuit that emulates a battery, i.e. that acts electrically similarly to a battery being charged, suitably for use in testing a battery charging device, e.g., a DC battery charger. Further, Applicant believes that need also applies regarding chargers for electric vehicles and their batteries.

Accordingly, an electrical circuit that emulates a battery when being charged may comprise: first and second terminals configured to have a battery charging device connected thereto; a regulator circuit connected to the first and second terminals including: a voltage sensing circuit connected to the first and second terminals for sensing the voltage therebetween and providing at an output thereof a voltage that is proportional to the voltage between the first and second terminals; a comparator circuit having first and second input terminals, the first input terminal being connected to the output of the voltage sensing circuit and the second terminal being connected to a reference voltage, the comparator circuit having an output at which an output signal responsive to the difference between the output of the voltage sensing circuit and the reference voltage; a controllable load circuit connected to the first and second terminals and including a controllable element that is responsive to the output signal from the comparator circuit for causing a current proportional to the output signal to flow between the first and second terminals; whereby the current flowing in the controllable load circuit is controlled thereby to tend to maintain the voltage between the first and second terminals at a voltage that is proportional to the reference voltage.

An electrical circuit that emulates a battery of or for an electric vehicle when being charged may comprise: first and second terminals configured to have a battery charging device connected thereto; a regulator circuit connected to the first and second terminals including: a voltage sensing circuit connected to the first and second terminals for sensing the voltage therebetween and providing at an output thereof a voltage that is proportional to the voltage between the first and second terminals; a comparator circuit having first and second input terminals, the first input terminal being connected to the output of the voltage sensing circuit and the second terminal being connected to a reference voltage, the comparator circuit having an output at which an output signal responsive to the difference between the output of the voltage sensing circuit and the reference voltage; a controllable load circuit connected to the first and second terminals and including a controllable element that is responsive to the output signal from the comparator circuit for causing a current proportional to the output signal to flow between the first and second terminals; whereby the current flowing in the controllable load circuit is controlled thereby to tend to maintain the voltage between the first and second terminals at a voltage that is proportional to the reference voltage.

In summarizing the arrangements described and/or claimed herein, a selection of concepts and/or elements and/or steps that are described in the detailed description herein may be made or simplified. Any summary is not intended to identify key features, elements and/or steps, or essential features, elements and/or steps, relating to the claimed subject matter, and so are not intended to be limiting and should not be construed to be limiting of or defining of the scope and breadth of the claimed subject matter.

BRIEF DESCRIPTION OF THE DRAWING

The detailed description of the preferred embodiment(s) will be more easily and better understood when read in conjunction with the FIGURES of the Drawing which include.

Figure 1:
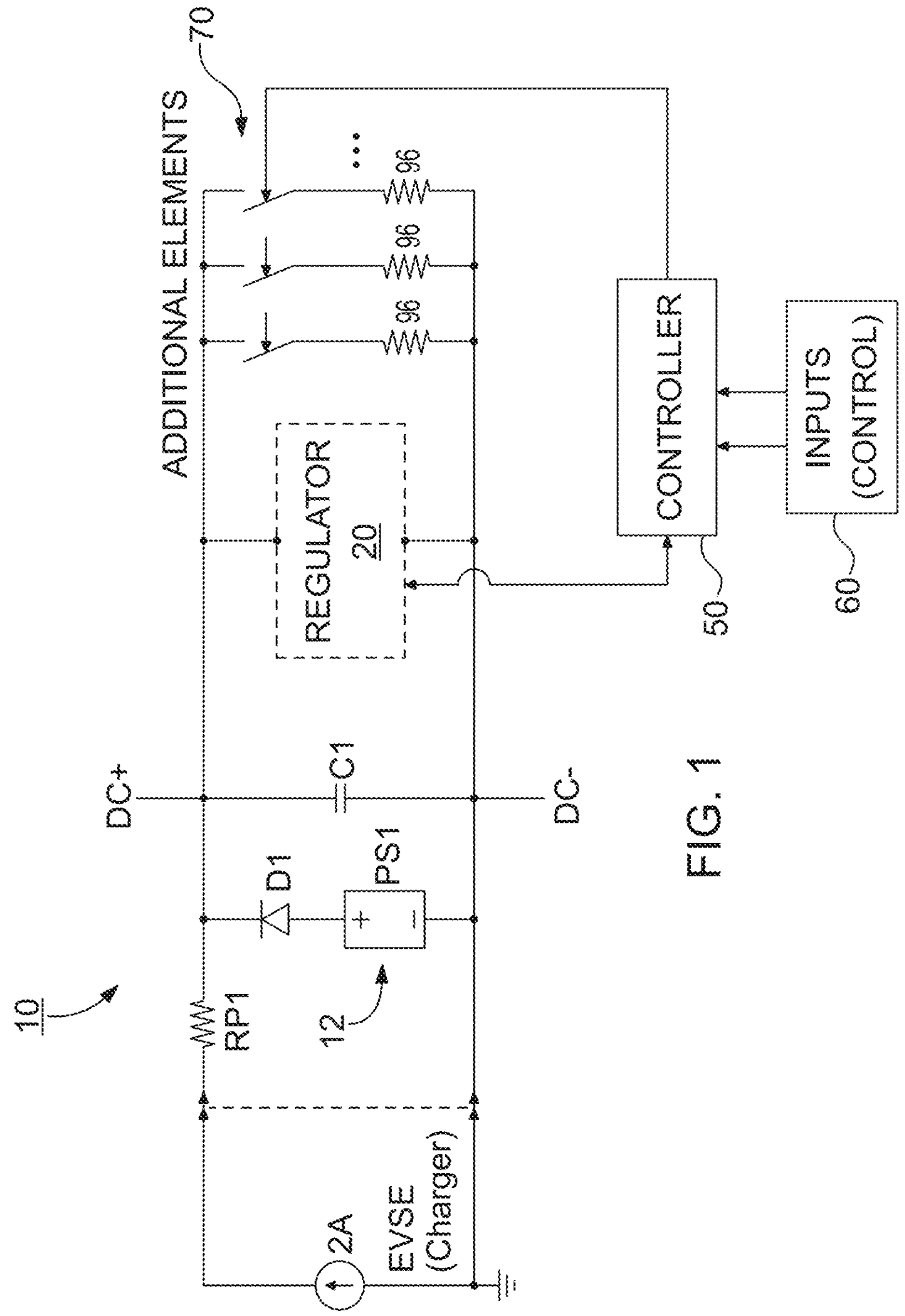
FIG. 1 is a schematic diagram of an example embodiment of an electrical device for emulating a battery being charged.

In the Drawing, where an element or feature is shown in more than one drawing figure, the same alphanumeric designation may be used to designate such element or feature in each figure, and where a closely related or modified element is shown in a figure, the same alphanumerical designation may be primed or designated "a" or "b" or the like to designate the modified element or feature. Similar elements or features may be designated by like alphanumeric designations in different figures of the Drawing and with similar nomenclature in the specification. As is common, the various features of the drawing are not to scale, the dimensions of the various features may be arbitrarily expanded or reduced for clarity, and any value stated in any Figure is by way of example only.

DESCRIPTION OF THE PREFERRED EMBODIMENT(S)

Electric vehicle battery chargers, i.e. DC battery chargers, are complex charging devices that typically "work with" many different vehicle batteries and can take into account temperature, battery state of charge, battery voltage level, and the like, and such chargers often "communicate" with the vehicle which communicates battery characteristics, desired battery charging parameters, e.g., a "target" charging current, full charge voltage, and/or rates of current ramping up and down, e.g., 10 amperes per second or 20 amperes per second; the EV battery charger often may set its own limits on charging parameters.

EV DC chargers typically have two operating modes: one for a nominal 400 VDC operation (in which voltage can reach up to less than 450 VDC), and a second for a nominal 800 VDC operation (in which voltage can reach up to less than 900 VDC). These are expected voltage ranges that EV charging devices are designed to accommodate. During charging of an actual battery, the EV charger may experience transients from vehicle equipment operation, e.g., operation of heaters and/or air conditioners, a radio or entertainment system, a GPS and other equipment and features, and so the EV charger is typically designed to accommodate such transients that are caused with an actual EV battery in a real-world situation; these changing load transients only cause voltage transients that are of short duration and small amplitude relative to the voltage of the EV battery.

EV chargers can, however, mis-react to transient changes in the load which is supposed to be a constant voltage device, e.g., a battery, when the transient is not a transient of the sort expected in a real-world battery charging situation. If the charger "senses" that the load, e.g., the test load, doesn't "look like" a real-world battery, as would be the case if the load were banks of switchable resistors which do not resemble a battery load, it may simply discontinue the charging. In addition, other smaller "non-battery-like" changes may be perceived by the charger to indicate that it is being tested and is not charging a "real battery," which is not desirable.

FIG. 1 is a schematic diagram of an example embodiment of an electrical device 10 for emulating a battery being charged. A battery, e.g., a battery for an electric vehicle, is a direct current (DC) device that has the terminal characteristic of being a substantially constant voltage device when being discharged and when being charged. The battery terminal voltage, i.e. the battery voltage, does change slightly as a function of the state of charge of the battery and of the level of current being withdrawn from the battery in discharge and the level of current being applied to charge the battery, but it is essentially a constant-voltage load on the battery charger.

In considering the description herein, if the reader can avoid the tendency to think of a battery in its common usage of supplying electrical power to a load and therefore being a constant voltage source that can provide what ever current a load may require, and to think of the battery emulator 10 not as a battery per se, but as a load that responds by accepting whatever "charging" current may be provided by the EVSE charger.

For EVS and EV batteries, the charging device EVSE tends to operate as DC current source that provides a controllable DC current to charge the vehicle battery, whether that battery is being charged while in the vehicle or is being charged apart from a vehicle. Charger of current source EVSE is illustrated in the Drawing by a circle having an arrow therein indicating the direction of the current it provides. Chargers EVSE are programmed to provide particular current profiles for properly charging EV batteries and an emulator 10 for an EV battery must accept the current provided by charger EVSE while maintaining a substantially constant terminal voltage, thereby to emulate the behavior of an actual EV battery.

Emulator 10 includes a regulator circuit 20 that acts to conduct current as necessary to maintain the terminal voltage DC+ of emulator 10 (relative to ground or DC−) substantially constant while regulator 20 absorbs varying levels of current from charger EVSE. The current that regulator 20 itself can absorb is limited, however, and that limit may be less than what may be required for testing a given EVSE charger. In that instance, one or more additional load elements 70, e.g., resistive load elements 70, can be connected into and out of the circuitry of emulator 10 so that the current that regulator 20 is required to absorb to maintain voltage DC+ at its desired voltage remains within the current carrying capacity of regulator 20 irrespective of variations of the total current provided by charger EVSE. Embodiments with 15-20 additional load elements 70 have been configured, e.g., with appropriate heat sinks, and operate without problems.

The speed of response of regulator 20 is sufficiently fast that battery emulator 10 is well able to handle, e.g., by changing the current it is conducting, the ramping up and ramping down of charging current that is induced by the EV charging device. Even though the ramping up of the charging current caused by the EV charger working to increase that current may require that several additional loads 70 be connected one after another in sequence, each will involve a current transient that is smaller than the current that regulator 20 conducts, and so each will in turn be counteracted quickly and effectively, e.g., with a voltage change at terminals DC+ and DC− that is sufficiently small, e.g., typically less than about five volts, which is too small to affect the operation of the charging device or its working to ramp up the charging current. In effect, the charging device is seeing in emulator 10 what appears to be an about 380-400 VDC battery which is the voltage the charging device is expecting to occur.

Regulator circuit 20, however, is relatively fast acting for changing the level of current it is carrying and so it is well able to counteract the load transients generated by switching additional loads 70 in and out of circuit in battery emulator 10. As a result, what starts as a fast change in load current transient caused by changing the load, e.g., by adding or removing a load 70, is essentially immediately counteracted by regulator 20 changing the current it is carrying by substantially an equal and opposite amount. As a result, the effect of those counteracting transients within emulator 10 produces a substantially reduced and much smaller, and typically inconsequential, transient at the terminals DC+ and DC− of battery emulator 10.

Emulator 10 includes a controller 50 that monitors the current being absorbed by regulator 10 to maintain regulator 20 within its operating limits of current. In particular, as that current in regulator 20 increases, controller 50 switches one or more additional loads 70 into the circuit such that regulator 20 remains within its operating limits and as that current decreases, controller 50 switches one or more additional loads 70 out of the circuit such that regulator 20 remains within its operating limits.

Resistive loads alone switched into and out of a battery emulator would not emulate battery behavior because when switched they introduce discrete rapid changes, e.g., essentially step increases and decreases, in the current conducted by emulator 10 which can affect its terminal voltage DC+. However, Applicant's inventive arrangement overcomes those undesired characteristics. Specifically, regulator 20 in conjunction with controller 50 respond relatively rapidly to counter the abrupt change in current that would occur from a resistive load alone because regulator 20 absorbs and/or releases a current that is substantially equal to and opposite to the current change caused by switching in and/or out the additional loads 70 which are resistive loads.

EV battery emulator 10 also includes a substantial capacitor C1, e.g., over 1 micro-Farad or larger, typically about 20 μF in the example embodiment, but could be as large as a milli-Farad, connected across its input terminals DC+ and DC− which absorbs smaller rapid changes in current level while regulator 20 adjusts its operating point to maintain terminal voltage DC+ at the desired level. A resistor or resistance RP1, which may be a small resistor RP1, e.g., a resistor of low ohmic value, or may be provided in whole or in part by wiring and/or connector resistance, generates a small voltage change that aids regulator 20 to respond to changes in the level of current being supplied by charger EVSE.

In the illustrated example embodiment 10, with the desired emulated battery voltage DC+ at about 400 VDC, each additional load 70 is capable of carrying a maximum current of slightly above 4 amperes when connected. Therein, regulator 20 could suffice if capable of carrying a current of up to about 4 amperes using about 100% of its range, however, regulator 20 is preferably configured to have a current capacity of about 8 amperes, or about twice the current capacity of each additional load 70. With that configuration, regulator 20 can operate entirely within its linear range when a load 70 is switched in circuit (connected) or is switched out of circuit (disconnected), and suitable set points for regulator 20 at about 25% and 75% of its maximum current appear to be a suitable set point for controller 50 to control adding and removing an additional load 70.

Also in that configuration, controller 50 may determine when to switch an additional load 70 in or out of emulator circuit 10 by responding to the measured current conducted by regulator 20 or by measuring a voltage related to that current.

Controller 50 may, and preferably does, include a microprocessor, microcontroller, and/or other processor that can be controlled and/or programmed for controlling the operation and characteristics of battery emulator 10. It is noted that controller 50 may be referred to herein as a microprocessor 50, a microcontroller 50, and/or a processor 50. Such processors 50 commonly include one or more analog-to-digital converters, one or more digital-to-analog converters, a reference voltage generator, and various inputs configured to receive analog or digital signals and various outputs configured to provide analog and/or digital signals. Control inputs to controller 50 can control, e.g., the value of the reference voltage VDAC provided to regulator 20 including programming VDAC over a period of time and/or over various testing and simulation sequences, and/or the states of connection of additional loads 70.

Certain EV charging stations may not operate properly when connected to an electric vehicle or a battery emulator if there is no voltage present that is representative of a battery being present. To avoid battery emulator 10 from seeming to not be a battery to an EV charging station, pre-charge emulator circuit 12 may be provided.

Pre-charge emulator 12 may comprise a source of electrical voltage PS1 representing a battery to be charged and a diode D1 in series therewith that are connected across the input terminals of battery emulator 10. For example, the voltage provided by power source PS1 may be in the range of about 250 VDC to 400 VDC for an emulator for emulating a 400 VDC battery, and similar ranges of voltage scaled for representing batteries to be charged of different voltages can be utilized.

Voltage source PS1 need not have capacity to provide a substantial current, as it only need provide a DC voltage representative of a battery to be charged. Typically, PS1 may only need to be able to provide a few hundred milliamperes or less. Power source PS1 may be, e.g., a power supply, a battery, a DC convertor and/or voltage regulator, or any other suitable source of DC voltage. Diode D1 prevents current from the charging station from flowing into power source PS1. While pre-charge emulator 12 is not necessary for operation of battery emulator circuit 10, pre-charge emulator 12 is preferably included therein.

Figure 2:
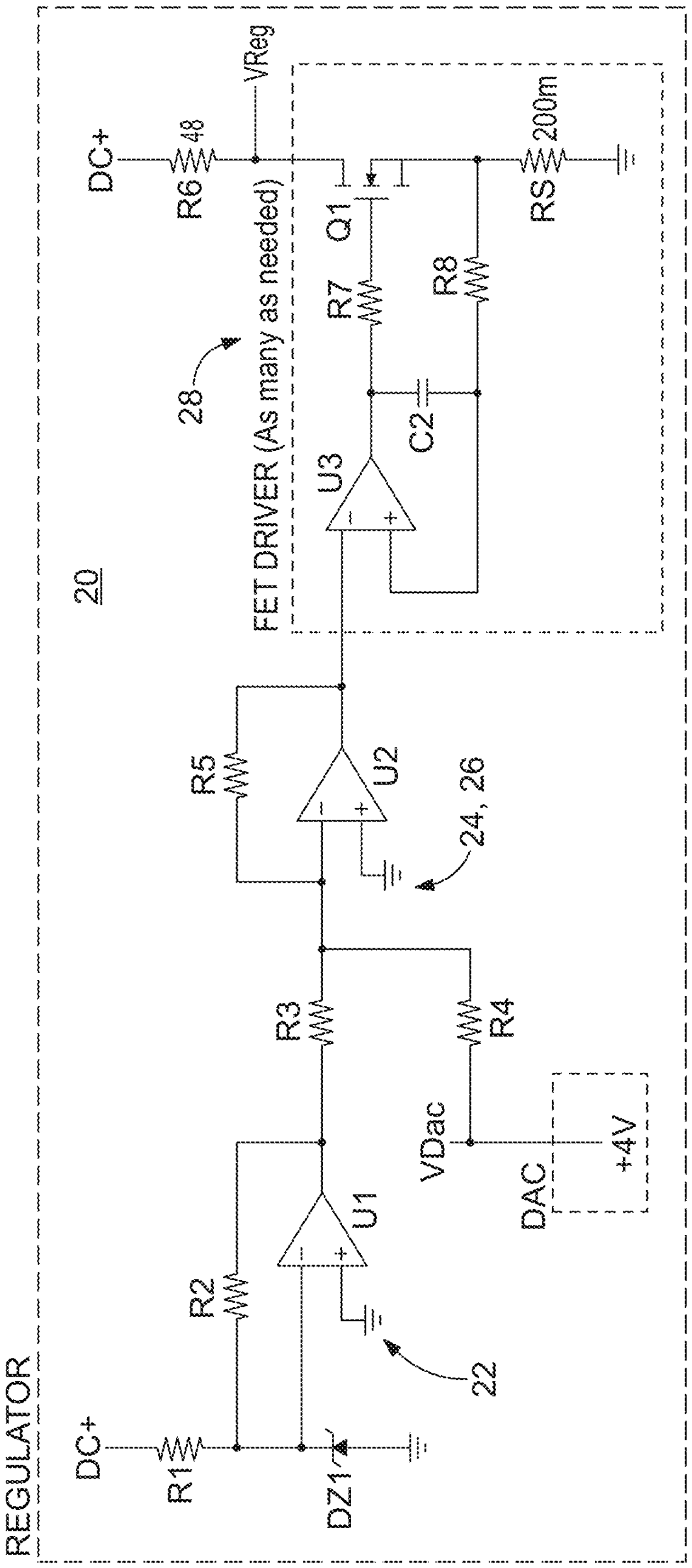
FIG. 2 is a schematic electrical circuit diagram of an example embodiment of a regulator circuit for use in the example embodiment of the battery emulator of FIG. 1.

FIG. 2 is a schematic electrical circuit diagram of an example embodiment of a regulator circuit 20 for use in the example embodiment of the battery emulator 10 of FIG. 1. Regulator circuit 20 includes: a voltage sensing circuit 22, a comparator circuit 24, an amplifier 26 and a controllable load circuit 28, R6. Integrated circuit amplifiers, operational amplifiers, instrumentation amplifiers, and other amplifiers, have inverting inputs (−) wherein their output voltage changes in a direction opposite to the direction of input voltage signals applied at its inverting (−) input and have non-inverting inputs (+) wherein their output voltage changes in the same direction as the direction of input voltage signals applied at its non-inverting (+) input.

Voltage sensing circuit 22 includes an operational amplifier U1, e.g., an integrated circuit U1 having substantial open circuit gain which is reduced by feedback to be a desired value of gain determined by the values of resistors R1 and R2. In one example embodiment, with amplifier U1 in a non-inverting configuration, the ratio R2/R1 is about 1/100 thereby providing a gain of about 0.01. If the desired emulated battery voltage +DC is 400 VDC, then the output of voltage sensing circuit 22 is about +4 VDC and any deviation therefrom represents an "error" signal representative of a deviation of voltage +DC from its programmed and desired voltage.

A diode DZ1 may be connected to the junction of R1 and R2 and the inverting input of amplifier U1 to provide protection against excessive voltage being applied at that input. Diode DZ1 is, e.g., a Zener diode or other voltage limiting circuit element, that tends to limit voltage. In normal operation, DZ1 is not conducting; in case of excessive positive voltage, diode DZ1 limits the voltage thereat to a value that is between the power supply voltages that are applied to operate the amplifier integrated circuit. If the amplifier power supply is about plus and minus 12-15 VDC relative to ground (DC−), then DZ1 can limit voltage to about 12 VDC and in case of excessive negative voltage, DZ1 limits the voltage to about-12 VDC.

Comparator circuit 24 includes an operational amplifier U2, e.g., an integrated circuit U2 having substantial open circuit gain which is reduced by feedback to be a desired value of gain determined by the values of resistors R3, R4 and R5. The non-inverting input of amplifier U2 receives a reference voltage VDAC via resistor R4 which determines the voltage to which +DC will be regulated. For example, if the reference voltage VDAC is +4 VDC as in the illustrated example, then +DC will be +4/0.01 =+400 VDC, i.e. the desired voltage of battery emulator 10.

The reference voltage VDAC for regulator 20 is provided by a reference source of which many different kinds may be employed; examples include a voltage reference diode such as a Zener diode, a voltage regulator integrated circuit, a reference output from a microprocessor or microcontroller, and the like. In the illustrated preferred embodiment, reference voltage VDAC is provided, e.g., by a digital-to-analog converter DAC so that the reference voltage can be controlled, e.g., under control of controller 50 which includes the digital-to-analog converter DAC and/or external signals and/or commands.

In addition to providing a comparator 24, amplifier U2 also serves as an inverting amplifier 26 whose gain is determined by the ratio of R5 to the effective resistance of parallel resistors R3 and R4. In one example embodiment, that ratio R5/(R3|R4) is configured to provide an effective overall gain of about two. Thus, amplifier U2 serves a dual function in this example embodiment.

One example of a controllable load circuit 28 includes a load resistor R6 in series with a controllable element Q1 connected across the input of emulator 10, e.g., between its first and second terminals +DC and −DC for conducting a controllable current therebetween that is at least a portion of the "charging" current being provided by a battery charger EVSE. The controllable element, e.g., a transistor Q1, is configured with an operational amplifier U3 which is in a unity-follower configuration controlled by resistors R7, R8 wherein capacitor C2 tends to smooth the rate of change of current through R6, Q1. Unity follower U3 provides an output voltage at the junction of transistor Q1 and resistor RS that is equal to the voltage at the non-inverting input of amplifier U3, i.e. it exhibits a voltage gain of +1.

Controllable element Q1 has a control terminal, e.g., the gate of a field-effect transistor (FET) Q1, coupled to the output of the amplifier U3, e.g., an operational amplifier U3, and having a controllable conduction path between output terminals, e.g., between the source and drain of FET Q1. Other controllable devices, e.g., junction transistors and other suitable semiconductor devices, may be employed as the controllable element. The controllable element in this instance will need to be able to operate with the highest terminal voltage of battery emulator 10, e.g., the terminal voltage of the battery charger connected to battery emulator 10, which can be 400 VDC, or 800 VDC, or 1000 VDC, depending upon the charger, and will also need to carry the maximum current of regulator 20 which could be 4 or 8 amperes, in the illustrated embodiment, or higher.

Where high current carrying capacity is needed, e.g., more than one FET driver and FET Q1 can handle, plural controllable loads 28 can be employed in parallel, and the total current will be accurately shared among the parallel loads 28 because of the configuration of the unity-follower FET driver circuit and the current sensing and controlling resistor RS of each. Up to 16 sets thereof in parallel have been tested without problem. Using plural controllable loads 28 also helps to allow the heat generated thereby to be spread out over a larger physical area, e.g., by power resistors mounted on heat sinks (heat dissipaters) that can include air or liquid heat removal devices, and/or other cooling arrangements.

Accordingly, the current that flows through resistor R6 and transistor Q1 of the controllable load 28 of regulator 20 is equal to the voltage at the non-inverting input to amplifier U3 divided by the resistance of current sensing resistor RS. Thus, the FET driver circuit including U3 and Q1 converts the voltage at the non-inverting input of amplifier U3 into a proportional current flowing through FET Q1 and resistor RS. The resistance of current sensing resistor RS may be any convenient value, but is typically one ohm or less. In the illustrated example, the resistance of RS is about 200 milli-ohms.

In each of the foregoing embodiments, the resistors R6 and resistive loads 70 include power resistors that are configured to dissipate the heat that is generated by the part of charger EVSE current that flows therein. Often such high power resistors include integrated heat conductive bodies that provide for removal of heat and/or that may be or are coupled to heat sinks, air cooling devices, water cooling devices, and the like, to have a power dissipation capability that is consistent with the maximum power that can be dissipated in each such power resistor. For example, where resistor R6 can carry as much as about 8 amperes in a simulated 400 VDC charging environment, that resistor R6 is rated to safely dissipate 2400 watts (2.4 kW) or if R6 comprises plural resistors R6, their aggregated power rating is 2400 watts.

Where battery emulator 10 is part of an item of test equipment of a general nature for testing a wide range of different battery chargers, e.g., EV battery chargers, current and power capacities of regulator 20 and the numbers of additional loads 70 and their power handling capacities, will be scaled to accommodate the highest power EV battery charger that could be tested using EV battery emulator 10. Such scaling may include increasing or decreasing the number and/or kinds of additional load circuits, changing the values of various elements, e.g., the reference voltage VDAC from the DAC and/or the values of the resistors that set the ratio between the terminal voltage DC+ of emulator 10 and the reference voltage VDAC.

Figure 3:
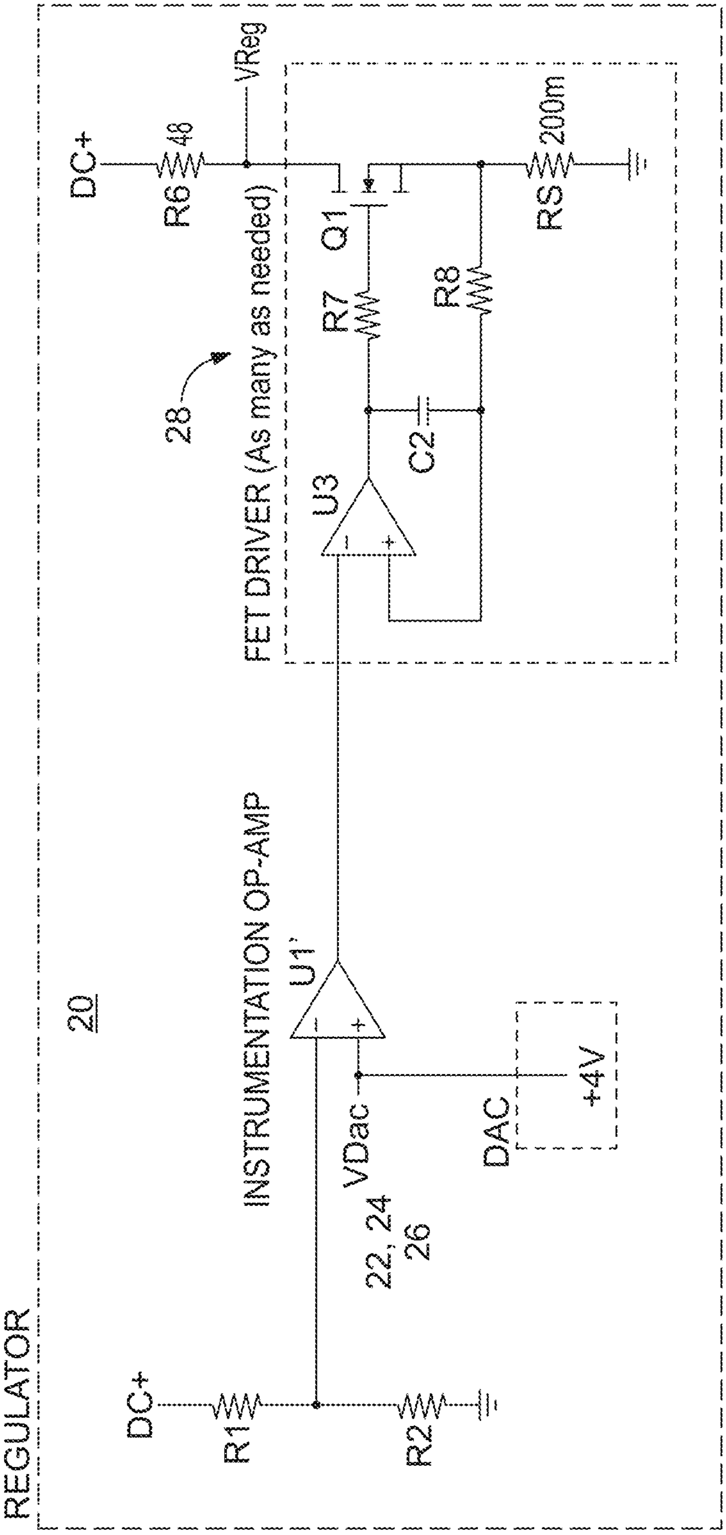
FIG. 3 is a schematic electrical circuit diagram of an example embodiment of a regulator circuit for use in the example embodiment of the battery emulator of FIG. 1.

FIG. 3 is a schematic electrical circuit diagram of an example embodiment of a regulator circuit 20' for use in the example embodiment of the battery emulator 10 of FIG. 1.

Regulator circuit 20' is functionally equivalent to regulator 20 previously described except that sensing circuit 22, comparator circuit 24 and amplifier 26 which include operational amplifiers U1 and U2 are replaced by an instrumentation amplifier U1'. Instrumentation amplifier U1' is an amplifier that has significant gain that is programmable, and is programmed here, to provide the desired gain and response for regulator 20', however, instrumentation amplifiers can have narrower bandwidth than do, e.g., are not as "fast" as, other amplifiers, e.g., operational amplifiers.

Here, instrumentation amplifier U1' is programmed to have a non-inverting gain, e.g., of about two, for providing negative feedback for correcting errors in the voltage +DC of battery emulator 10 relative to its desired programmed voltage.

Resistors R1, R2 perform the same voltage sensing function as described above and controllable load circuit 28 including FET driver U3, Q1 function as described above. The operation of regulator 20' is the same as that of regulator 20 described above. As a result, battery emulator 10 operates in the substantially the same way whether regulator 20 or regulator 20' is employed therein.

Further regarding regulator 20 and additional loads 70, controller 50 preferably responds to the level of current being conducted by regulator 20 for determining when to connect an additional load 70 and/or to disconnect an additional load 70. When the current being provided from charging device EVSE changes, e.g., increases as when charger EVSE is ramping up, then when the current being conducted by regulator 20 increases concomitantly until it approaches its maximum level. Controller 50 detects that condition of regulator 20 and responds by connecting an additional load 70. The current drawn by additional load 70 causes a slight negative transient in the voltage at terminals DC+ and DC− of emulator 70 which causes the voltage sensing and comparator circuitry 22, 24, 26 of regulator 20 to reduce the current drawn by controllable load 28 by an equal amount so that the total of the current drawn by regulator 20 and the additional load 70 is substantially the same as the total current immediately prior to the additional load 70 being connected.

As a result, regulator 20 is always operated within the range of currents over which it can exercise control. Thereby, controller 50 operates such that regulator 20 is always operated within the range of current over which it can exercise control, e.g., between the minimum level of 0% and the maximum level of 100% of its current carrying capacity.

Providing a signal representing the current being conducted by regulator 20 to controller 50 can be done is several alternative ways. For example, the voltage across current sensing resistor RS is directly related to that current and controller 50 can monitor that voltage. When, e.g., RS is 200 milli-ohms and the maximum current is about 8 amperes, 100% of current is represented by 1.60 volts (1600 mV) across resistor RS. When, e.g., the high and low current "limits" are set for 10% and 90% of maximum current, controller 50 would be configured to detect 0.16 v and 1.44 v, respectively, across resistor RS. Alternatively, when, e.g., the high and low current "limits" are set for 25% and 75% of maximum current, controller 50 would be configured to detect 0.40 v and 1.20 v, respectively.

Alternatively, the current flowing in regulator 20 can be monitored by monitoring the voltage at the connection of the source terminal of FET Q1 and load resistor R6 which is labeled VREG in FIGS. 2 and 3. Consider the case where the voltage of the battery being emulated is 400 VDC. When, e.g., the high and low current "limits" are set for 10% and 90% of maximum current, controller 50 would be configured to detect 360 v and 40 v, respectively, at point VREG. Alternatively, when, e.g., the high and low current "limits" are set for 25% and 75% of maximum current, controller 50 would be configured to detect 300 v and 100 v, respectively.

Detection of voltage levels by controller 50 may be accomplished by setting up thresholds to be detected at analog inputs thereto or internally thereto after the analog voltage across RS or at VREG is converted by an analog-to-digital converter of controller 50 and is detected digitally therein. Alternatively, analog comparators may be employed for voltage detection.

Preferably, the value of resistor R6 is made to be less than the resistance of the additional loads 70 thereby providing additional current range for regulator 20 than is needed to offset any additional load 70 being connected or disconnected. In one embodiment of the example battery emulator 10 illustrated, resistor R6 is 48 ohms and additional load 70 resistors are 96 ohms. Said differently, each additional load 70 draws about 4.16 amperes at an emulated battery voltage DC+ of 400 VDC, and regulator 20 can draw up to about 8.3 amperes.

With the foregoing arrangement, regulator 20 is more easily made to operate within its linear range when regulating emulator 10 voltage DC+no matter the total current level when an additional load 70 is connected or disconnected. The foregoing design points are satisfactory and provide greater margin, and so are preferred at this time, providing an about 2:1 ratio between regulator 20 current and load 70 current. However, all that is necessary is that the maximum current of regulator 20 be greater than the current of each additional load 70, thereby to keep battery emulator 10 in linear active operation.

Further with respect to FIG. 1, in addition to providing a predetermined reference voltage VDAC as described above, controller 50 cooperates with battery emulator 10 including regulator 20 for emulator 10 having electrical characteristics consistent with a battery being charged, and is configured to provide additional capability thereto. For example, because controller 50 in the example embodiment includes the digital-to-analog converter DAC that provides the reference voltage VDAC to regulator 20, controller 50 can change the reference voltage VDAC which controls the terminal voltage DC+ of the battery being emulated.

Controller 50 can change, or be controlled to change, reference VDAC to change emulator 10 to interface and test an EVSE battery charger that has a different terminal voltage and/or a different terminal voltage profile and/or to test a different mode of an EVSE battery charger wherein the mode has a different terminal voltage, e.g., a different value thereof, or a different terminal voltage profile, e.g., a terminal voltage that changes over time in a certain or predetermined manner.

For example, in the illustrated embodiment where a VDAC of +4 VDC causes emulator 10 to emulate a 400 VDC battery, e.g., DC+=400 VDC, changing the reference voltage VDAC to +6 VDC will cause emulator 10 to emulate a 600 VDC battery, and changing the reference voltage VDAC to +8 VDC will cause emulator 10 to emulate a 800 VDC battery, and so forth for other voltages over a wide range of voltages. Such changes can be effected by controller 50 responsive to manual inputs and/or to programmable inputs.

By way of further example, voltage VDAC in the illustrated embodiment can be varied over time, if, when, and as desired. For example, the terminal voltage of a rechargeable battery will be lower when the battery is discharged and will increase when charging begins, e.g., going from a zero current in or out condition, i.e. an open circuit condition, to a condition of receiving charging current. As the battery is recharged, the terminal voltage thereof will increase slowly and slightly until it reaches a voltage consistent with being fully charged.

Controller 50 can be programmed to vary the reference voltage VDAC such that the terminal voltage DC+ of battery emulator 10 varies as if the state of charge of the battery it emulates as reflected in its terminal voltage DC+ is increasing as a result of being charged, thereby more realistically emulating a "real" battery.

Further, the foregoing changes to the voltage DC+ at the terminals of battery emulator 10 emulating the battery being emulated 10 can be, and preferably are, controlled responsive to inputs to controller 50, which inputs can be provided from various different sources, e.g., manual switches and other controls, or from an external control input device, or by calls to programming of controller 50.

The series-connected switches of each of additional loads 70 shown schematically are controlled individually by controller 50, as is illustrated by the arrow therebetween in FIG. 1, may be of any suitable kind of controllable electrical switches. For example, the switch of each additional load 70 may be provided by contacts of an electrical relay or of an electronic relay, or by a semiconductor switching device, e.g., a FET or other transistor such as FET Q1 illustrated.

While the analog controllable load 28 including a control element Q1 and a power dissipating element, e.g., resistance R6, are known to work well, other configurations for controllable load 28 may be employed. For example, the control element Q1 may be a field-effect transistor Q1 as described, or an insulated-gate bipolar transistor (IGBT), or another controllable element. Controllable element Q1 can be operated in an analog manner wherein the current flowing in controllable load 28 is essentially a controlled continuous or "direct current" circuit as illustrated and described; this sort of circuit is also known as a linear regulator circuit.

Alternatively, control element Q1 can be operated in a switched manner, e.g., being switched ON and OFF at a high repetition rate, with an ON time that is variable relative to the repetition rate so that the average current flow is a function of the resistive value of resistor R6 and the ratio of the ON time to the sum of the ON and OFF times of element Q1 averaged over many switching cycles, e.g., in what is known as a PWM (pulse-width modulated) operation. Typically, the repetition rate is sufficiently high that an electrical storage element, e.g., a capacitor such as capacitor C1 as described, has sufficient capacitance to smooth the voltage of emulator 10 to appear substantially constant at the terminals of emulator 10. Circuits of this sort are known as a switching regulator circuit or a switching power supply.

In addition, electrical energy storage elements can be included in controllable load 28 for providing functionality equivalent to that already described. For example, inductors can be used to smooth the current flow in controllable element 28 wherein the controllable element Q1 is operated in a PWM switched operation, and may be configured as a typical "buck" or down converting configuration whose output voltage is lower than its input voltage, or in a "boost" or up converting configuration whose output voltage is higher than its input voltage, as well as other configurations. Circuits of this sort are known as a switching regulator circuit or a switching power supply.

The foregoing configurations may be controlled by various configurations of an analog control loop 20 or of a digital control loop wherein ADCs (analog-to-digital converters), processors, and/or DACs perform the control functions as described herein. Therein, a PWM output of the processor can drive the load circuit, directly if the controllable load circuit is a switched (PWM) circuit or using a DAC when the controllable load circuit is an analog load, and using an ADC of the processor for monitoring the emulated battery voltage.

Metal parts, such as supports, heat sinks, springs and fasteners, may be of any suitable metal, e.g., aluminum, steel, spring steel, metal wires, brass, bronze, phosphor bronze, magnesium, beryllium copper, and the like.

An electrical circuit that emulates a battery when being charged comprising: first and second terminals configured to have a battery charging device connected thereto; a regulator circuit connected to the first and second terminals including: a voltage sensing circuit connected to the first and second terminals for sensing the voltage therebetween and providing at an output thereof a voltage that is proportional to the voltage between the first and second terminals; a comparator circuit having first and second input terminals, the first input terminal being connected to the output of the voltage sensing circuit and the second terminal being connected to a reference voltage, the comparator circuit having an output at which an output signal responsive to the difference between the output of the voltage sensing circuit and the reference voltage; a controllable load circuit connected to the first and second terminals and including a controllable element that is responsive to the output signal from the comparator circuit for causing a current proportional to the output signal to flow between the first and second terminals; whereby the current flowing in the controllable load circuit is controlled thereby to tend to maintain the voltage between the first and second terminals at a voltage that is proportional to the reference voltage. The electrical circuit that emulates a battery when being charged wherein the voltage sensing circuit includes at least first and second resistors in series wherein the output of the voltage sensing circuit is the connection of the first resistor to the second resistor. The electrical circuit that emulates a battery when being charged wherein the comparator circuit includes an amplifier having first and second input terminals connected respectively to the output of the voltage sensing circuit and to the reference voltage. The electrical circuit that emulates a battery when being charged wherein the amplifier includes first and second operational amplifiers each having a first and a second input terminal, wherein the first input terminal of the first operational amplifier is connected to the output of the voltage sensing circuit, the first input terminal of the second operational amplifier is connected to the output of the first operational amplifier and the second input terminal of the second operational amplifier is connected to the reference voltage. The electrical circuit that emulates a battery when being charged wherein the amplifier is an instrumentation amplifier. The electrical circuit that emulates a battery when being charged wherein the controllable load circuit includes: a controllable semiconductor device; or a field-effect transistor; or an integrated gate bipolar transistor; or a linear regulator circuit; or a switching regulator circuit. The electrical circuit that emulates a battery when being charged wherein the controllable load circuit includes a power resistor in series with the controllable element. The electrical circuit that emulates a battery when being charged wherein the controllable load circuit includes a voltage to current converting driver circuit. The electrical circuit that emulates a battery when being charged wherein the controllable load circuit includes: an amplifier having a non-inverting input coupled to the output of the comparator, having an inverting input, and having an output; a controllable element having a control terminal coupled to the output of the amplifier, and having a controllable conduction path between output terminals, and a current sensing resistor having a terminal connected to an end of the controllable conduction path of the controllable element; wherein the inverting input of the amplifier is connected to the connection of the current sensing resistor and the terminal of the controllable conduction path of the controllable element. The electrical circuit that emulates a battery when being charged further comprising: one or more additional load elements, each load element including electrical contacts by which it can be connected across the first and second terminals and disconnected from the first and second terminals; and a controller responsive to current flowing in the controllable element of the regulator circuit configured to open and close the electrical contacts of ones of the additional load elements to maintain the current flowing in the controllable element of the regulator circuit within a range of current that is controllable by the regulator circuit. The electrical circuit that emulates a battery when being charged wherein the controller responds to a range of current of the regulator circuit that: is between about 10% and about 90% of a maximum current that is controllable by the regulator circuit; or is between about 25% and about 75% of the maximum current that is controllable by the regulator circuit. The electrical circuit that emulates a battery when being charged wherein the reference voltage is provided by a digital-to-analog converter. The electrical circuit that emulates a battery when being charged further comprising a controller, wherein the controller includes a digital-to-analog converter, and wherein the reference voltage is provided by the digital-to-analog converter. The electrical circuit that emulates a battery when being charged wherein the controller is responsive to control inputs for controlling the reference voltage provided by the digital-to-analog converter. The electrical circuit that emulates a battery when being charged wherein the controllable load circuit: is operated in an analog manner; and/or is operated in a switched ON/OFF manner. The electrical circuit that emulates a battery when being charged may further comprise a pre-charge emulator including a source of electrical voltage representing a battery to be charged.

An electrical circuit that emulates a battery of or for an electric vehicle when being charged comprising: first and second terminals configured to have a battery charging device connected thereto; a regulator circuit connected to the first and second terminals including: a voltage sensing circuit connected to the first and second terminals for sensing the voltage therebetween and providing at an output thereof a voltage that is proportional to the voltage between the first and second terminals; a comparator circuit having first and second input terminals, the first input terminal being connected to the output of the voltage sensing circuit and the second terminal being connected to a reference voltage, the comparator circuit having an output at which an output signal responsive to the difference between the output of the voltage sensing circuit and the reference voltage; a controllable load circuit connected to the first and second terminals and including a controllable element that is responsive to the output signal from the comparator circuit for causing a current proportional to the output signal to flow between the first and second terminals; whereby the current flowing in the controllable load circuit is controlled thereby to tend to maintain the voltage between the first and second terminals at a voltage that is proportional to the reference voltage. The electrical circuit that emulates a battery of or for an electric vehicle when being charged wherein the voltage sensing circuit includes at least first and second resistors in series wherein the output of the voltage sensing circuit is the connection of the first resistor to the second resistor. The electrical circuit that emulates a battery of or for an electric vehicle when being charged wherein the comparator circuit includes an amplifier having first and second input terminals connected respectively to the output of the voltage sensing circuit and to the reference voltage. The electrical circuit that emulates a battery of or for an electric vehicle when being charged wherein the amplifier includes first and second operational amplifiers each having a first and a second input terminal, wherein the first input terminal of the first operational amplifier is connected to the output of the voltage sensing circuit, the first input terminal of the second operational amplifier is connected to the output of the first operational amplifier and the second input terminal of the second operational amplifier is connected to the reference voltage. The electrical circuit that emulates a battery of or for an electric vehicle when being charged wherein the amplifier is an instrumentation amplifier. The electrical circuit that emulates a battery of or for an electric vehicle when being charged wherein the controllable load circuit includes: a controllable semiconductor device; or a field-effect transistor; or an integrated gate bipolar transistor; or a linear regulator circuit; or a switching regulator circuit. The electrical circuit that emulates a battery of or for an electric vehicle when being charged wherein the controllable load circuit includes a power resistor in series with the controllable element. The electrical circuit that emulates a battery of or for an electric vehicle when being charged wherein the controllable load circuit includes a voltage to current converting driver circuit. The electrical circuit that emulates a battery of or for an electric vehicle when being charged wherein the controllable load circuit includes: an amplifier having a non-inverting input coupled to the output of the comparator, having an inverting input, and having an output; a controllable element having a control terminal coupled to the output of the amplifier, and having a controllable conduction path between output terminals, and a current sensing resistor having a terminal connected to an end of the controllable conduction path of the controllable element; wherein the inverting input of the amplifier is connected to the connection of the current sensing resistor and the terminal of the controllable conduction path of the controllable element. The electrical circuit that emulates a battery of or for an electric vehicle when being charged further comprising: one or more additional load elements, each load element including electrical contacts by which it can be connected across the first and second terminals and disconnected from the first and second terminals; and a controller responsive to current flowing in the controllable element of the regulator circuit configured to open and close the electrical contacts of ones of the additional load elements to maintain the current flowing in the controllable element of the regulator circuit within a range of current that is controllable by the regulator circuit. The electrical circuit that emulates a battery of or for an electric vehicle when being charged wherein the controller responds to a range of current of the regulator circuit that: is between about 10% and about 90% of a maximum current that is controllable by the regulator circuit; or is between about 25% and about 75% of the maximum current that is controllable by the regulator circuit. The electrical circuit that emulates a battery of or for an electric vehicle when being charged wherein the reference voltage is provided by a digital-to-analog converter. The electrical circuit that emulates a battery of or for an electric vehicle when being charged further comprising a controller, wherein the controller includes a digital-to-analog converter, and wherein the reference voltage is provided by the digital-to-analog converter. The electrical circuit that emulates a battery of or for an electric vehicle when being charged wherein the controller is responsive to control inputs for controlling the reference voltage provided by the digital-to-analog converter. The electrical circuit that emulates a battery of or for an electric vehicle when being charged wherein the controllable load circuit: is operated in an analog manner; and/or is operated in a switched ON/OFF manner. The electrical circuit that emulates a battery of or for an electric vehicle when being charged may further comprise a pre-charge emulator including a source of electrical voltage representing a battery to be charged.

As used herein, the terms "about," "approximate" and/or "approximately" mean that dimensions, sizes, formulations, parameters, shapes and other quantities and characteristics are not and need not be exact, but may be approximate and/or larger or smaller, as desired, reflecting tolerances, conversion factors, rounding off, measurement error and the like, judgment, and other factors known to those of ordinary skill in the art. In general, a dimension, size, formulation, parameter, shape or other quantity or characteristic is "about" or "approximate" or "substantial" or "substantially" whether or not expressly stated to be such. It is noted that embodiments of very different sizes, shapes and dimensions may employ the described arrangements.

Although terms such as "front," "back," "rear," "side," "end," "top," "bottom," "up," "down," "left," "right," "upward," "downward," "forward," "backward," "under" and/or "over," "vertical," "horizontal," and the like may be used herein as a convenience in describing one or more embodiments and/or uses of the present arrangement, the articles described may be positioned in any desired orientation and/or may be utilized in any desired position and/or orientation. Such terms of position and/or orientation should be understood as being for convenience only, and not as limiting of the invention as claimed.

As used herein, the term "and/or" encompasses both the conjunctive and the disjunctive cases, so that a phrase in the form "A and/or B" encompasses "A" or "B" or "A and B." Likewise, a phrase in the form "A, B and/or C" or a phrase in the form "A and/or B and/or C" includes "A," "B," "C," "A and B," "A and C," "B and C," and "A and B and C." In addition, the term "at least one of" one or more elements is intended to include one of any one of the elements, more than one of any of the elements, and two or more of the elements up to and including all of the elements, and so, e.g., phrases in the form "at least one of A, B and C" include "A," "B," "C," "A and B," "A and C," "B and C," and "A and B and C."

As used herein, the term "predetermined" means determined in advance or before hand with respect to whatever the term pertains to. The term may be used with respect to a physical object or thing and/or with respect to an intangible thing, e.g., a signal or data, and the like. Examples thereof may include a fixed value, position, condition and/or limit, however, predetermined is not limited to a fixed value, position, condition and/or limit. A predetermined value, position, condition and/or limit may change or otherwise vary over time, over a sequence and/or over a randomized series of values, positions, conditions and/or limits.

As used herein, the term "plurality" means plural, two or greater in number of whatever the term pertains to, i.e. more than one. The term may be used with respect to a physical object or thing and/or with respect to an intangible thing, e.g., a signal or data, and the like. Examples thereof may include a fixed or movable thing, a fixed value, a changeable value, position, condition and/or limit, and the like.

As used herein, the terms "substantial" and "substantially" mean that the thing referred to as being "substantial" or "substantially" is sufficiently similar in form and/or function and/or value as to usable in the invention in a manner that is encompassed or suggested by the description and/or claims herein, and/or an equivalent thereof. The terms "substantial" and "substantially" can include and/or can be in addition to the meaning of the terms "about," "approximate" and/or "approximately" herein.

As used herein, the terms "connected" and "coupled" as well as variations thereof may or may not be intended to be exact synonyms, but may also encompass some similar things and some different things, and those terms are used interchangeably herein. While the term "connected" as indicated by its context may be used generally to refer to elements that have a direct electrical and/or physical contact to each other, whereas the term "coupled" as indicated by its context may be used generally to refer to elements that have an indirect electrical and/or indirect physical contact with each other, e.g., via one or more intermediate elements, so as to cooperate and/or interact with each other, and may include elements in direct contact as well.

The term "battery" may be used herein to refer generally to a source of electrical power as well as to an electro-chemical device comprising one or more electro-chemical cells and/or fuel cells, and so a battery may include a single cell or plural cells, whether as individual units or as a packaged unit. A battery is one example of a type of an electrical power source suitable for an EV or for a portable or other device, and the batteries/power sources that are emulated by emulator 10 are rechargeable power sources. Plural ones thereof may be combined into a battery pack or battery assembly or other such assembly or pack, and any, some or all thereof may be referred to herein under the general term battery.

While the present invention has been described in terms of the foregoing example embodiments, variations within the scope and spirit of the present invention as defined by the claims following will be apparent to those skilled in the art. For example, while additional loads 70 are illustrated as resistors in series with switch contacts (e.g., contacts or a relay or other switching device) which is a suitable configuration, plural resistors, whether in series or in parallel or in a series/parallel arrangement, may be employed to help to spread the power dissipation therein over a heat sink or other cooling arrangement.

In addition, plural electrical contacts may be provided in an additional load 70 for differently configuring the resistors thereof under different operating conditions. For example, where the charging device is an electric vehicle charging device, it may operate for charging EV batteries having different terminal voltages, e.g., 400 VDC and 800 VDC. In one example thereof, two additional loads 70 may be configured to be switched by their respective electrical contacts to be connected in a parallel configuration when battery emulator 10 is operating to emulate a 400 VDC battery and to be switched by their respective contacts to be connected in a series configuration when battery emulator 10 is operating to emulate a 800 VDC battery.

Each of the U.S. Provisional Applications, U.S. Patent Applications, and/or U.S. Patents, identified herein is hereby incorporated herein by reference in its entirety, for any purpose and for all purposes irrespective of how it may be referred to or described herein.

Finally, numerical values stated are typical or example values, are not limiting values, and do not preclude substantially larger and/or substantially smaller values. Values in any given embodiment may be substantially larger and/or may be substantially smaller than the example or typical values stated.

[BeginTestParas:]

DOCX: ± ≤ ≥ ≈ Å µ ⊕ ⊖ ½ ¼ ⅓ $ ™ ® © § ✓ √
ASCHI ™ § © ® ° ± µ ¶ Å
GRK: Αα Ββ ΓΔ Εε Ζη Θθ Λλ Μµ Νν Ππ Ρρ Σσ
Τ Φφ Χχ Ψψ Ωω
NTRFont: ( ) * + − < = > ? [ ] ™ § © ® µ
¼ ½ ¾ Å @ ! " # $ % & ' ( ) + − / @ ~ ||
KYBDCAB: ™ ~ + − _ ! @ # $ % ^ & *
( ) − _ =+ [ ] { } || [EndTest].

What is claimed is:

1. An electrical circuit that emulates a battery when being charged comprising:

first and second terminals configured to have a battery charging device connected thereto;

a controller that provides a reference voltage representative of a battery being emulated;

a regulator circuit connected to the first and second terminals including:

a voltage sensing circuit connected to the first and second terminals for sensing the voltage therebetween and providing at an output thereof a voltage that is proportional to the voltage between the first and second terminals;

a comparator circuit having first and second input terminals, the first input terminal being connected to the output of the voltage sensing circuit and the second terminal being connected to the reference voltage, the comparator circuit having an output at which an output signal responsive to the difference between the output of the voltage sensing circuit and the reference voltage;

a controllable load circuit connected to the first and second terminals and including a controllable element that is responsive to the output signal from the comparator circuit for causing a current proportional to the output signal to flow between the first and second terminals; and whereby the current flowing in the controllable load circuit is controlled thereby to tend to maintain the voltage between the first and second terminals at a voltage that is proportional to the reference voltage.

2. The electrical circuit that emulates a battery when being charged of claim 1 wherein the voltage sensing circuit includes at least first and second resistors in series wherein the output of the voltage sensing circuit is the connection of the first resistor to the second resistor.

3. The electrical circuit that emulates a battery when being charged of claim 1 wherein the comparator circuit includes an amplifier having first and second input terminals connected respectively to the output of the voltage sensing circuit and to the reference voltage.

4. The electrical circuit that emulates a battery when being charged of claim 3 wherein the amplifier includes first and second operational amplifiers each having a first and a second input terminal, wherein the first input terminal of the first operational amplifier is connected to the output of the voltage sensing circuit, the first input terminal of the second operational amplifier is connected to the output of the first operational amplifier and the second input terminal of the second operational amplifier is connected to the reference voltage.

5. The electrical circuit that emulates a battery when being charged of claim 2 wherein the amplifier is an instrumentation amplifier.

6. The electrical circuit that emulates a battery when being charged of claim 1 wherein the controllable load circuit includes:

a controllable semiconductor device; or a field-effect transistor; or an integrated gate bipolar transistor; or a linear regulator circuit; or a switching regulator circuit.

7. The electrical circuit that emulates a battery when being charged of claim 1 wherein the controllable load circuit includes a power resistor in series with the controllable element.

8. The electrical circuit that emulates a battery when being charged of claim 1 wherein the controllable load circuit includes a voltage to current converting driver circuit.

9. The electrical circuit that emulates a battery when being charged of claim 1 wherein the controllable load circuit includes:

an amplifier having a non-inverting input coupled to the output of the comparator, having an inverting input, and having an output;

a controllable element having a control terminal coupled to the output of the amplifier, and having a controllable conduction path between output terminals, and a current sensing resistor having a terminal connected to an end of the controllable conduction path of the controllable element;

wherein the inverting input of the amplifier is connected to the connection of the current sensing resistor and the terminal of the controllable conduction path of the controllable element.

10. The electrical circuit that emulates a battery when being charged of claim 1 further comprising:

one or more additional load elements, each load element including electrical contacts by which it can be connected across the first and second terminals and disconnected from the first and second terminals;

wherein the controller is responsive to current flowing in the controllable element of the regulator circuit configured to open and close the electrical contacts of ones of the additional load elements to maintain the current flowing in the controllable element of the regulator circuit within a range of current that is controllable by the regulator circuit.

11. The electrical circuit that emulates a battery when being charged of claim 10 wherein the controller responds to a range of current of the regulator circuit that:

is between about 10% and about 90% of a maximum current that is controllable by the regulator circuit; or is between about 25% and about 75% of the maximum current that is controllable by the regulator circuit.

12. The electrical circuit that emulates a battery when being charged of claim 1 wherein the reference voltage is provided by a digital-to-analog converter.

13. The electrical circuit that emulates a battery when being charged of claim 1 wherein the controller includes a digital-to-analog converter, and wherein the reference voltage is provided by the digital-to-analog converter.

14. The electrical circuit that emulates a battery when being charged of claim 13 wherein the controller is responsive to control inputs for controlling the reference voltage provided by the digital-to-analog converter.

15. The electrical circuit that emulates a battery when being charged of claim 1 wherein the controllable load circuit:

is operated in an analog manner; and/or is operated in a switched ON/OFF manner.

16. The electrical circuit that emulates a battery when being charged of claim 1 further comprising a pre-charge emulator including a source of electrical voltage representing a battery to be charged.

17. An electrical circuit that emulates a battery of or for an electric vehicle when being charged comprising:

first and second terminals configured to have a battery charging device connected thereto;

a controller that provides a reference voltage representative of a battery of or for an electric vehicle being emulated;

a regulator circuit connected to the first and second terminals including:

a voltage sensing circuit connected to the first and second terminals for sensing the voltage therebetween and providing at an output thereof a voltage that is proportional to the voltage between the first and second terminals;

a comparator circuit having first and second input terminals, the first input terminal being connected to the output of the voltage sensing circuit and the second terminal being connected to a reference voltage, the comparator circuit having an output at which an output signal responsive to the difference between the output of the voltage sensing circuit and the reference voltage;

a controllable load circuit connected to the first and second terminals and including a controllable element that is responsive to the output signal from the comparator circuit for causing a current proportional to the output signal to flow between the first and second terminals;

whereby the current flowing in the controllable load circuit is controlled thereby to tend to maintain the voltage between the first and second terminals at a voltage that is proportional to the reference voltage.

18. The electrical circuit that emulates a battery of or for an electric vehicle when being charged of claim 17 wherein the voltage sensing circuit includes at least first and second resistors in series wherein the output of the voltage sensing circuit is the connection of the first resistor to the second resistor.

19. The electrical circuit that emulates a battery of or for an electric vehicle when being charged of claim 17 wherein the comparator circuit includes an amplifier having first and second input terminals connected respectively to the output of the voltage sensing circuit and to the reference voltage.

20. The electrical circuit that emulates a battery of or for an electric vehicle when being charged of claim 19 wherein the amplifier includes first and second operational amplifiers each having a first and a second input terminal, wherein the first input terminal of the first operational amplifier is connected to the output of the voltage sensing circuit, the first input terminal of the second operational amplifier is connected to the output of the first operational amplifier and the second input terminal of the second operational amplifier is connected to the reference voltage.

21. The electrical circuit that emulates a battery of or for an electric vehicle when being charged of claim 17 wherein the amplifier is an instrumentation amplifier.

22. The electrical circuit that emulates a battery of or for an electric vehicle when being charged of claim 17 wherein the controllable load circuit includes:

a controllable semiconductor device; or a field-effect transistor; or an integrated gate bipolar transistor; or a linear regulator circuit; or a switching regulator circuit.

23. The electrical circuit that emulates a battery of or for an electric vehicle when being charged of claim 17 wherein the controllable load circuit includes a power resistor in series with the controllable element.

24. The electrical circuit that emulates a battery of or for an electric vehicle when being charged of claim 17 wherein the controllable load circuit includes a voltage to current converting driver circuit.

25. The electrical circuit that emulates a battery of or for an electric vehicle when being charged of claim 17 wherein the controllable load circuit includes:

an amplifier having a non-inverting input coupled to the output of the comparator, having an inverting input, and having an output;

a controllable element having a control terminal coupled to the output of the amplifier, and having a controllable conduction path between output terminals, and a current sensing resistor having a terminal connected to an end of the controllable conduction path of the controllable element;

wherein the inverting input of the amplifier is connected to the connection of the current sensing resistor and the terminal of the controllable conduction path of the controllable element.

26. The electrical circuit that emulates a battery of or for an electric vehicle when being charged of claim 17 further comprising:

one or more additional load elements, each load element including electrical contacts by which it can be connected across the first and second terminals and disconnected from the first and second terminals;

wherein the controller is responsive to current flowing in the controllable element of the regulator circuit configured to open and close the electrical contacts of ones of the additional load elements to maintain the current flowing in the controllable element of the regulator circuit within a range of current that is controllable by the regulator circuit.

27. The electrical circuit that emulates a battery of or for an electric vehicle when being charged of claim 26 wherein the controller responds to a range of current of the regulator circuit that:

is between about 10% and about 90% of a maximum current that is controllable by the regulator circuit; or is between about 25% and about 75% of the maximum current that is controllable by the regulator circuit.

28. The electrical circuit that emulates a battery of or for an electric vehicle when being charged of claim 17 wherein the reference voltage is provided by a digital-to-analog converter.

29. The electrical circuit that emulates a battery of or for an electric vehicle when being charged of claim 17 wherein the controller includes a digital-to-analog converter, and wherein the reference voltage is provided by the digital-to-analog converter.

30. The electrical circuit that emulates a battery of or for an electric vehicle when being charged of claim 29 wherein the controller is responsive to control inputs for controlling the reference voltage provided by the digital-to-analog converter.

31. The electrical circuit that emulates a battery of or for an electric vehicle when being charged of claim 17 wherein the controllable load circuit:

is operated in an analog manner; and/or is operated in a switched ON/OFF manner.

32. The electrical circuit that emulates a battery of or for an electric vehicle when being charged of claim 17 further comprising a pre-charge emulator including a source of electrical voltage representing a battery to be charged.

* * * * *